United States Patent
Choi et al.

(10) Patent No.: US 6,281,076 B1
(45) Date of Patent: Aug. 28, 2001

(54) METHOD FOR MANUFACTURING NONVOLATILE MEMORY DEVICE CAPABLE OF PREVENTING DAMAGE TO SIDE WALLS OF STACKED GATE AND ACTIVE REGION

(75) Inventors: Yong-ju Choi, Seoul; Jeong-hyuk Choi, Suwon, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/427,430

(22) Filed: Oct. 25, 1999

(30) Foreign Application Priority Data

Oct. 26, 1998 (KR) .................................................. 98-44805

(51) Int. Cl.⁷ .................................................. H01L 21/336
(52) U.S. Cl. .......................... 438/257; 438/259; 438/297; 438/258; 257/316
(58) Field of Search .................................. 438/257, 294, 438/297, 211, 259, 264, 258, 239; 365/185; 257/316, 320; 364/490, 491

(56) References Cited

U.S. PATENT DOCUMENTS

| | | |
|---|---|---|
| 5,120,671 | 6/1992 | Tang et al. . |
| 5,470,773 | 11/1995 | Liu et al. . |
| 5,950,085 * | 9/1999 | Kojima et al. ........................ 438/257 |
| 5,950,086 * | 9/1999 | Takahashi et al. ................... 438/258 |
| 5,976,927 * | 11/1999 | Hsieh et al. .......................... 438/239 |
| 5,998,262 * | 12/1999 | Chen ..................................... 438/257 |
| 6,136,651 * | 10/2000 | Chen ..................................... 438/257 |

* cited by examiner

Primary Examiner—Charles Bowers
Assistant Examiner—Laura M Schillinger
(74) Attorney, Agent, or Firm—Cantor Colburn LLP

(57) ABSTRACT

A method for manufacturing a nonvolatile memory device is provided. After forming an etching damage prevention layer on the entire surface of a stacked gate structure and on the entire surface of a semiconductor substrate, a self-aligned source etching process is performed. Thus, damage to side walls of the stacked gate structure and an active region can be prevented during the self-aligned source etching process.

7 Claims, 8 Drawing Sheets

METHOD FOR MANUFACTURING NONVOLATILE MEMORY DEVICE CAPABLE OF PREVENTING DAMAGE TO SIDE WALLS OF STACKED GATE AND ACTIVE REGION

BACKGROUND OF THE INVENTION

1. Field of the Invention

The present invention relates to a method for manufacturing a nonvolatile memory device, and more particularly, to a method for manufacturing a nonvolatile memory device capable of preventing damage to side walls of a stacked gate and active region.

2. Description of the Related Art

In order to attain a highly integrated nonvolatile memory device, various researches into a technology for reducing the cell size in a word line direction and a bit line direction have been carried out. An example of the technology, a so-called self-aligned source etching technology is disclosed in U.S. Pat. No. 5,120,671, by which limitations in reducing the cell size due to the presence of an active region in which a source line diffusion layer for connecting source regions of neighboring cells in a word line direction are solved. In other words, instead of forming the active region for forming the source line diffusion layer, a field oxide layer is etched to form the source line diffusion layer under the field oxide layer, thereby connecting source regions of neighboring cells in a word line direction. According to the self-aligned source etching technology, since an active region for forming a source line diffusion layer is not necessary for an insulation distance between the word line and active region where the source line diffusion layer will be formed is necessary, the size of a memory cell array can be reduced.

According to the self-aligned source etching process, first, a stacked gate structure is formed on a substrate where a field oxide layer has been formed. The stacked gate structure comprises a gate oxide layer, a floating gate, a dielectric layer and a control gate which are sequentially stacked. Next, a mask for exposing source regions of neighboring cells in a direction of the control gate which functions as a word line. Subsequently, the field oxide layer exposed by the mask is etched using the word line as a self-align mask and impurities are implanted thereinto to form a source line diffusion layer for connecting the source regions of neighboring cells.

During the self-aligned source etching process, the side walls of the stacked gate structure close to the source regions are exposed to the self-aligned source etch. Thus, the gate oxide layer, the floating gate, the intergate dielectric layer, some the control gate and the substrate are subject to etching damage. Particularly, the gate oxide layer and the intergate dielectric layer are severely damaged, which degrades the characteristics of a nonvolatile memory device.

Also, during the self-aligned source etching process, the active region where the source region is formed is etched as well as the field oxide layer. In other words, a silicon substrate of the active region is over-etched 300 Å or more, which causes etching damage to the source region. If the etching damage is generated, a charge retention capability is reduced. To solve the etching damage, annealing may be adopted. However, the annealing, which must be performed at a high temperature of 900–1000° C., creates another problem.

To avoid such etching damage, a technology for forming a spacer at side walls of a stacked gate structure prior to the self-aligned source etching process is disclosed in U.S. Pat. No. 5,470,773. If the spacer is formed according to this method, the damage problem of the side walls of the stacked gate stricture can be solved. However, the damage problem of the active region is yet to be solved. Also, two-step processes are further necessary for forming the spacer, that is, one step of forming a dielectric layer for a spacer, and another step of forming the dielectric layer as a spacer by anisotropically etching the same.

SUMMARY OF THE INVENTION

To solve the above problems, it is an objective of the present invention to provide a method for manufacturing a nonvolatile memory device which can prevent damage to side walls of a stacked gate structure and an active region when a self-aligned source etching process is performed.

To achieve the above objective according to the present invention, there is provided a method for manufacturing a nonvolatile memory device, in which an etching damage prevention layer is formed on the entire surface of the stacked gate structure and on the active region and then a self-aligned source etching process is performed thereon.

In detail, a plurality of active regions are defined by forming a plurality of field oxide layers extending parallel in one direction on a semiconductor substrate. Subsequently, a plurality of stacked gates perpendicular to the plurality of active regions is formed. Next, source and drain regions are formed within the active regions exposed between the stacked gates. An etching damage prevention layer is formed on the entire surface of the stacked gates and on the active regions. The semiconductor substrate are exposed by etching the field oxide layers exposed between the stacked gates. Finally, source line diffusion layers for connecting the source regions in a direction parallel to the stacked gates are formed by implanting an impurity into the exposed semiconductor substrate.

The etching damage prevention layer is preferably formed by thermal oxidation and is preferably formed to a thickness of at least two times that of the gate oxide layer.

The etching step is performed by using a self-aligned source etching mask exposing the field oxide layers in a direction parallel to the stacked gates, and the source line diffusion layer is formed by using the self-aligned source etching mask as an ion implantation mask.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
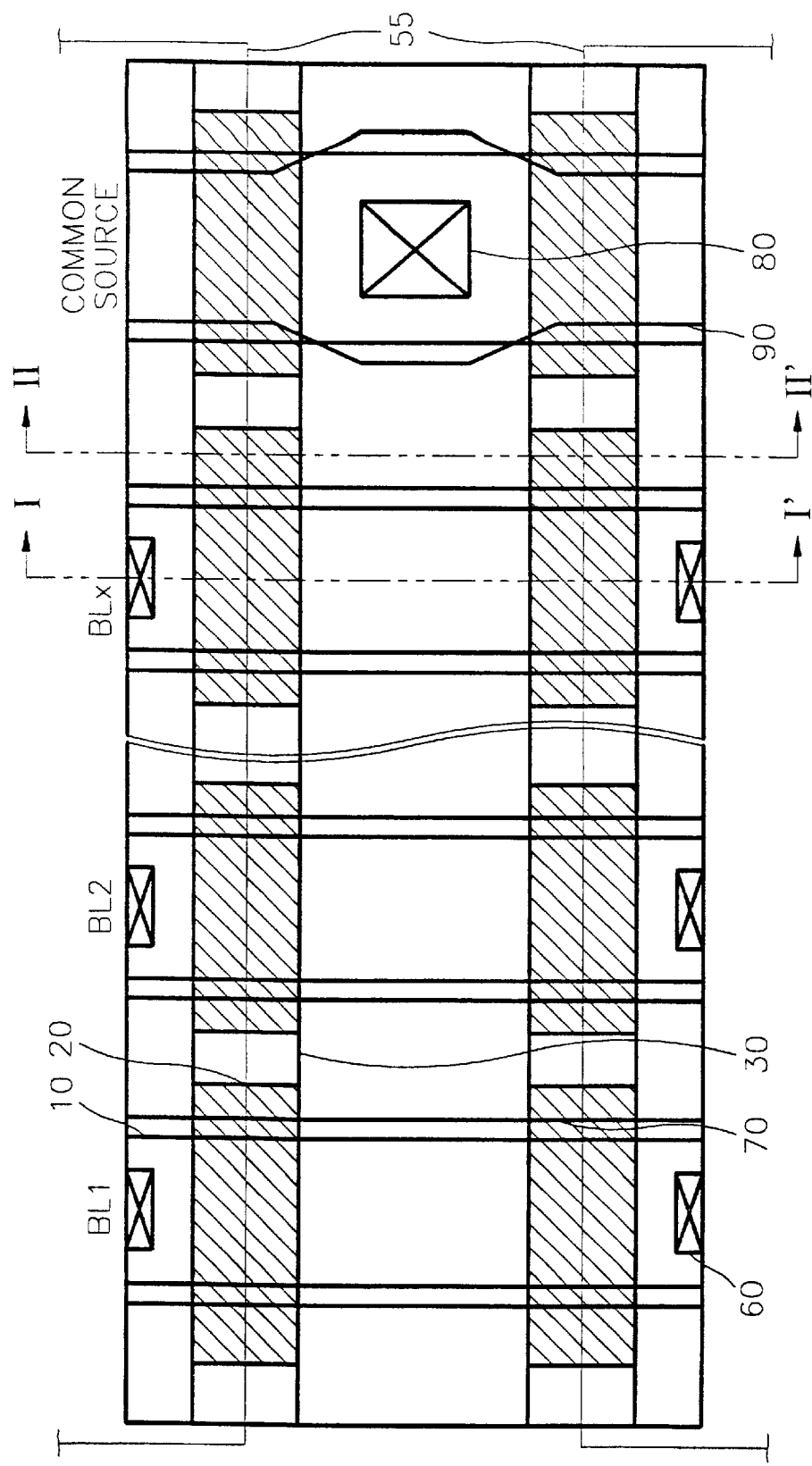
FIG. 1 is a layout diagram illustrating a flash memory cell array formed according to the present invention.

Hereinbelow, preferred embodiments of the present invention will be described in detail with reference to the accompanying drawings. However, the present invention is not limited to the following embodiments and is implemented in various forms. These embodiments are provided only for perfecting tile disclosure of the invention and conveying the scope of the invention to those who have ordinary skills in the art. Throughout the drawings, thicknesses of various films and areas are emphasized for clarity. In the drawings, the same elements are designated by the same numbers.

Figure 2:
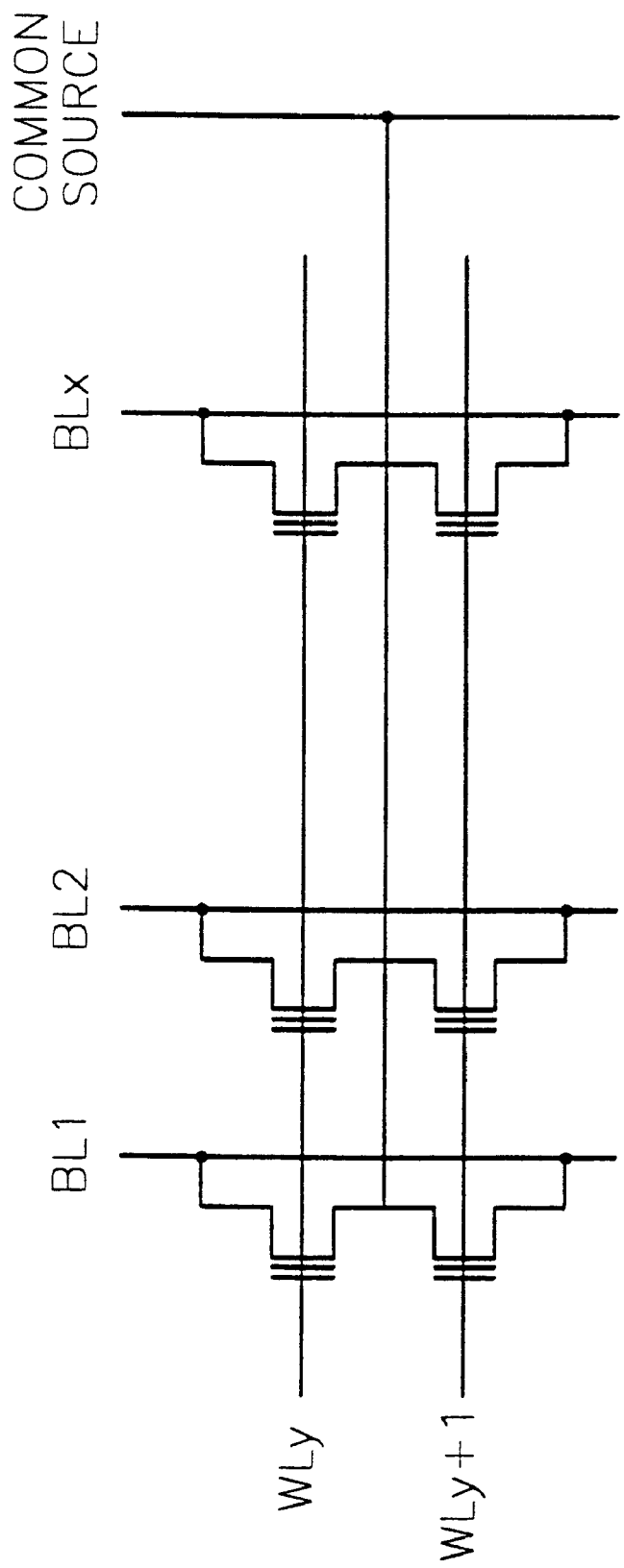
FIG. 2 is an equivalent circuit diagram illustrating the flash memory shown in FIG. 1.

The manufacturing method of the present invention is appropriate for use with a non-volatile memory device, and more particularly, with EPROM, EEPROM, flash EPROM or flash EEPROM. In the following embodiments, a flash memory will be described by way of example, FIG. 1 is a layout diagram illustrating a flash memory cell array formed according to the present invention, and FIG. 2 is an equivalent circuit diagram illustrating the flash memory cell array shown in FIG. 1.

Reference numeral 10 denotes an active region pattern, reference numeral 20 denotes a floating gate pattern, reference numeral 30 denotes a control gate pattern functioning as a word line, reference numeral 55 denotes a mask pattern for self-align etching process, reference numeral 60 denotes a bit line contact hole pattern, reference numeral 70 denotes a bit line pattern, reference numeral 80 denotes a source line contact bole pattern, and reference numeral 90 denotes a common source line pattern, respectively.

Now, a method for manufacturing a flash memory cell array area according to the present invention will be described with reference to FIGS. 3A through 8B.

Figure 3A:
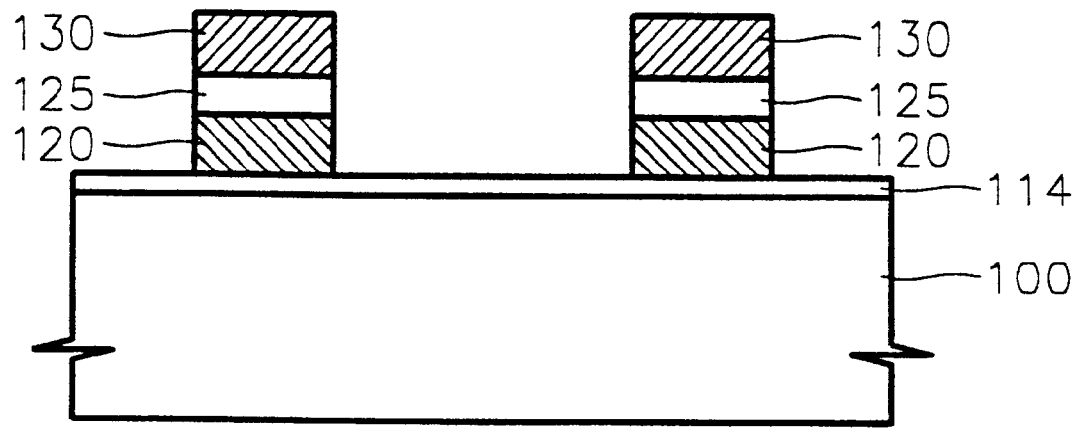
FIGS. 3A through 8B are cross-sectional views illustrating the sequence of steps for manufacturing the flash memory according to the present invention, in which the "A" drawings are cross-sectional views taken along the line I–I' of FIG. 1, and the "B" drawings are cross-sectional views taken along the line II–II' of FIG. 1.
Figure 3B:
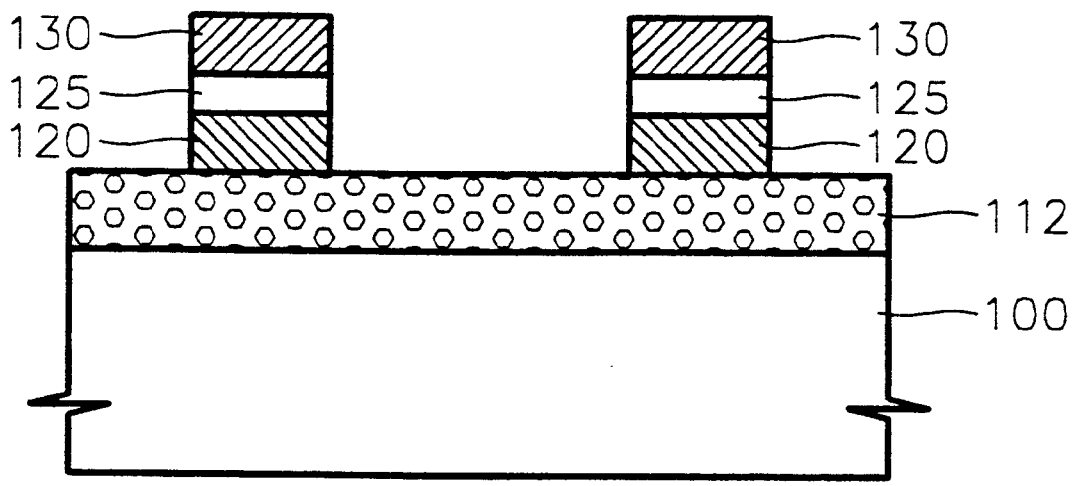

Referring to FIGS. 3A and 3B, a field oxide layer 112 is formed on a semiconductor substrate 100 to define an active region. A gate oxide layer 114 is formed on the active region and the field oxide layer 112 to a thickness of 90–100 Å. A first conductive layer for forming a floating gate is formed on the gate oxide layer 114. The first conductive layer is formed by depositing a polysilicon layer and performing a doping process thereon to give it conductivity. Here, phosphorus oxychloride ($POCl_3$) deposition or n-type ion implantation is employed. Subsequently, the first conductive layer is patterned so as to be isolated from a neighboring cell in a bit line direction, using a mask.

The mask for forming the floating gate is removed and then an intergate dielectric layer is formed. The intergate dielectric layer is preferably formed of an ONO (oxide/nitride/oxide) layer to thicknesses of 50–90 Å, 80–120 Å and 50–60 Å, respectively. Next, a second conductive layer for forming a control gate is formed. The second conductive layer is formed of a single layer of polysilicon and a double, layer of polysilicon and metal silicide. Subsequently, the second conductive layer, the intergate dielectric layer and the first conductive layer are sequentially patterned to complete the stacked gate structure comprising the floating gate 120, the intergate dielectric layer 125 and the control gate 130.

Figure 4A:
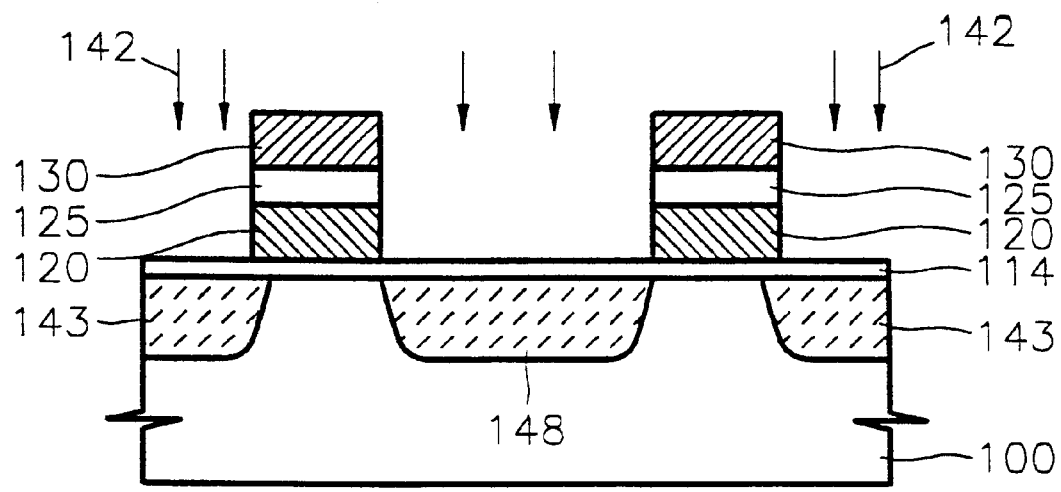
Figure 4B:
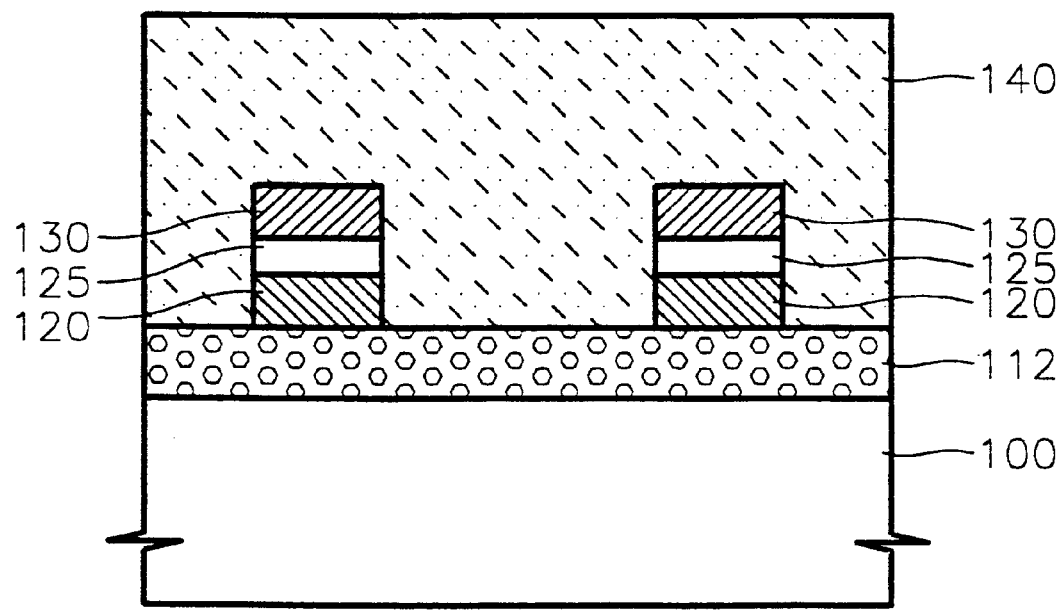

Referring to FIGS. 4A and 4B, an ion implantation mask 140 for forming source/drain regions is formed on the resultant structure including the stacked gate. The mask 140 is formed by depositing a photoresist layer and patterning the same. According to a kind of a device, an n-type or P-type impurity 142 is implanted using the ion implantation mask 140 to form a drain region 143 and a source region 148.

Figure 5A:
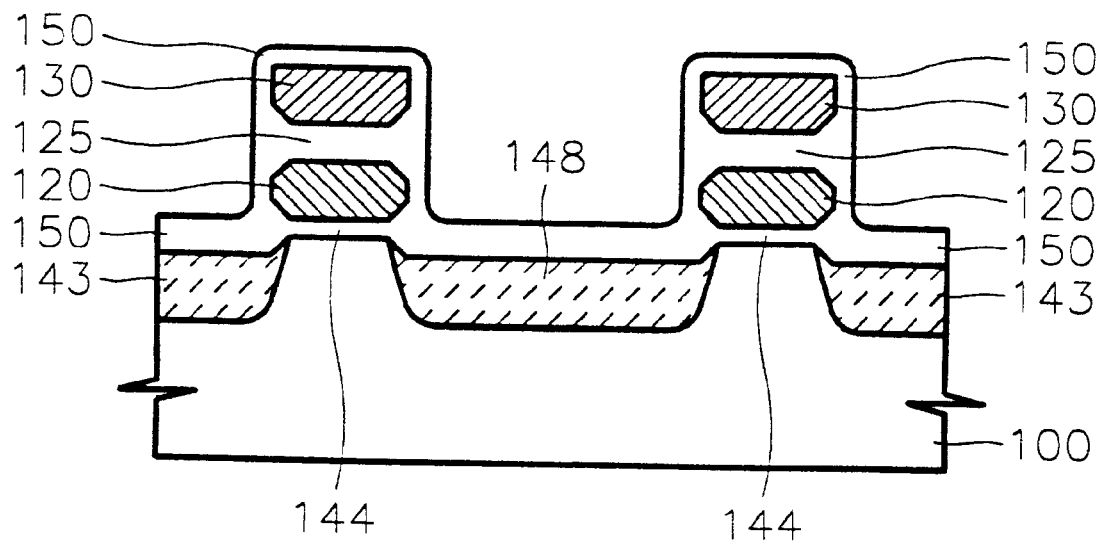
Figure 5B:
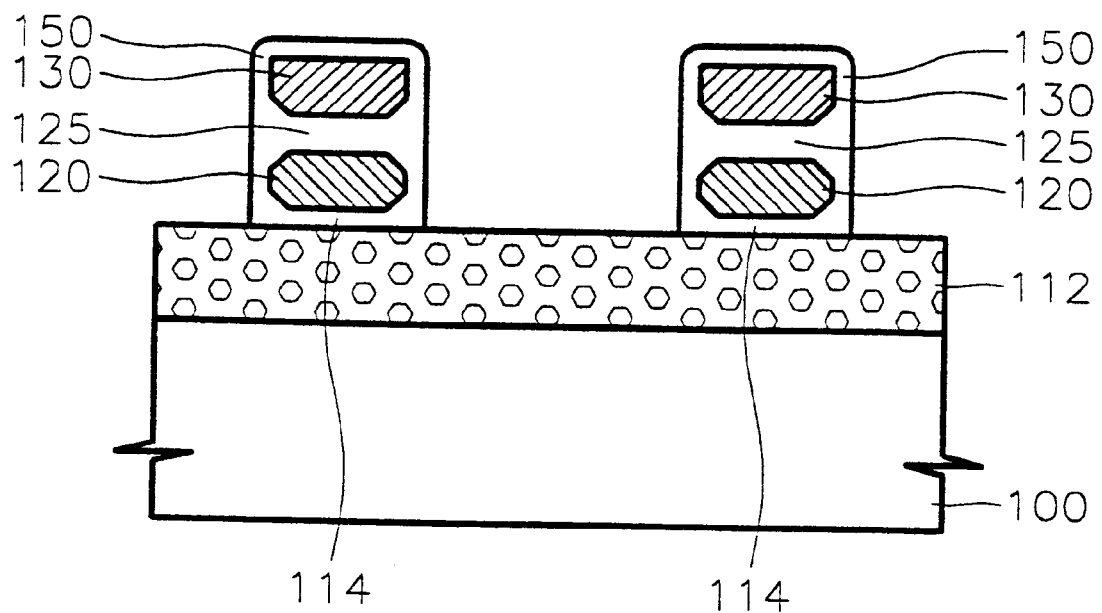

Referring to FIGS. 5A and 5B, the ion implantation mask 140 for the drain region 143 and the source region 148 is removed and then thermal oxidation is performed to form an etching damage prevention layer 150. The etching damage prevention layer 150 is formed over the exposed surface of the gate oxide layer 114, floating gate 120, intergate dielectric layer 125 and control gate 130 and over the entire surface of the substrate 100.

The etching damage prevention layer 150 is preferably formed to be at least two times thicker than the gate oxide layer 114, i.e., 200–300 Å. If the etching damage prevention layer 150 is formed to less than two times as thick as the gate oxide layer 114, etching damage preventing function may not be properly executed during a self-aligned source etching process, by which the gate oxide layer 114 may be damaged.

Thus conditions of the thermal oxidation are determined by the thickness of the to-be-formed etching damage prevention layer 150. For example, in case of a wet etching process, the thermal oxidation is performed at a temperature of 850–900° C. for 10–20 minutes. In case of a dry etching process, the thermal oxidation is performed at a temperature of 850–900° C. for 20–30 minutes.

Figure 6A:
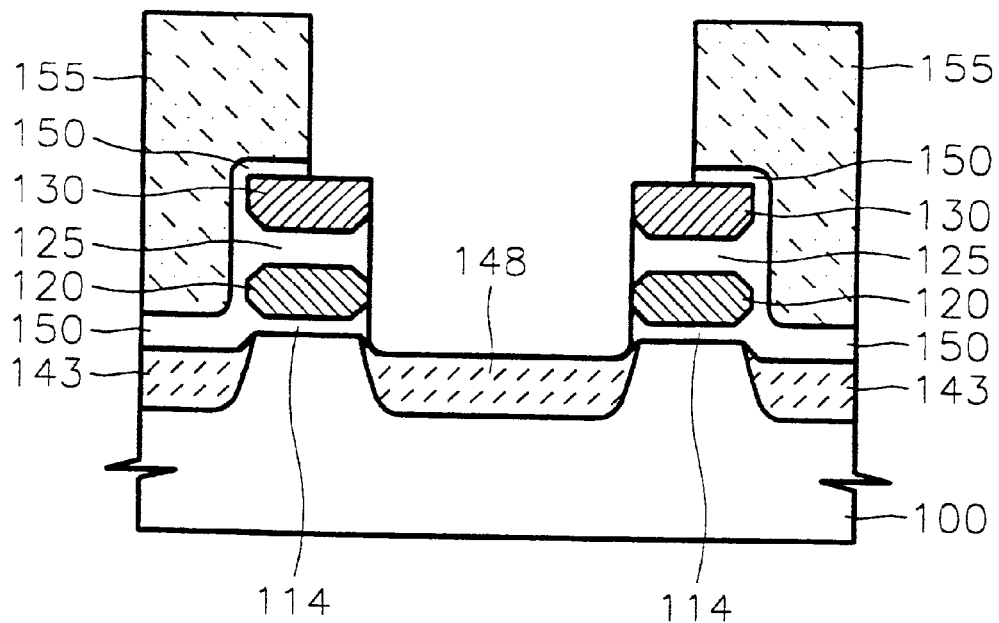
Figure 6B:
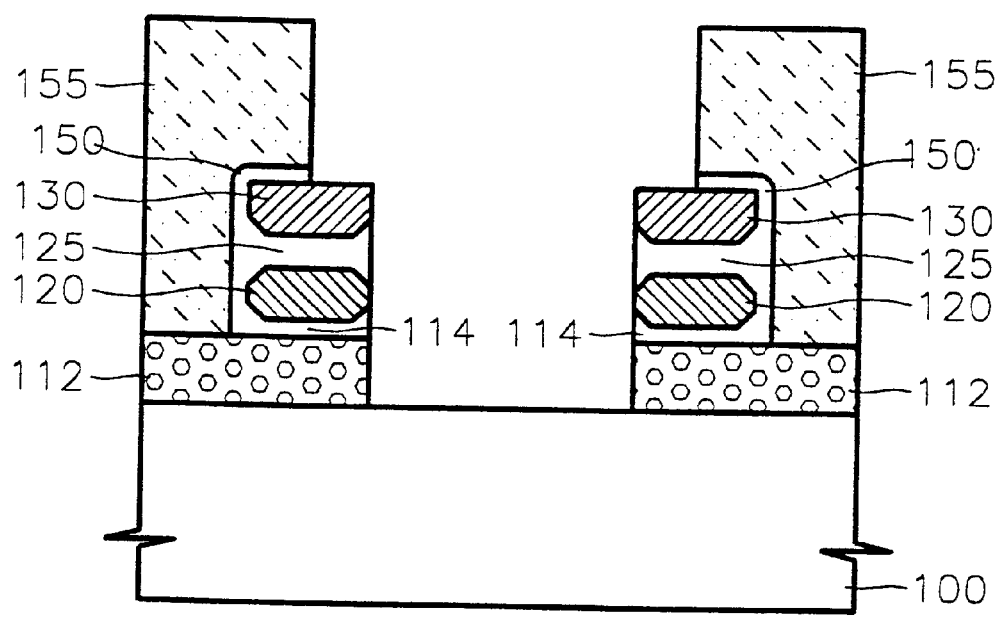

Referring to FIGS. 6A and 6B, a self-aligned source etching mask 155 covering the drain region 143 and exposing source regions 148 of neighboring cells and the field oxide layer 112 is formed on the resultant structure having the etching damage prevention layer 150, in a direction parallel to the control gate 130 functioning as a word line.

The exposed field oxide layer 112 is etched using the self-aligned source etching mask 155 and the control gate 130 as an etching mask to expose the semiconductor substrate 100.

The etching damage prevention layer 150 prevents side walls of the gate oxide layer 114, floating gate 120, intergate dielectric layer 125 and control gate 130 from being damaged when the field oxide layer 112 is etched.

Also, since the etching damage prevention layer 150 is formed on the active region where the source region 148 is formed, it also prevents the active region from being damaged when the field oxide layer 112 is etched.

Figure 7A:
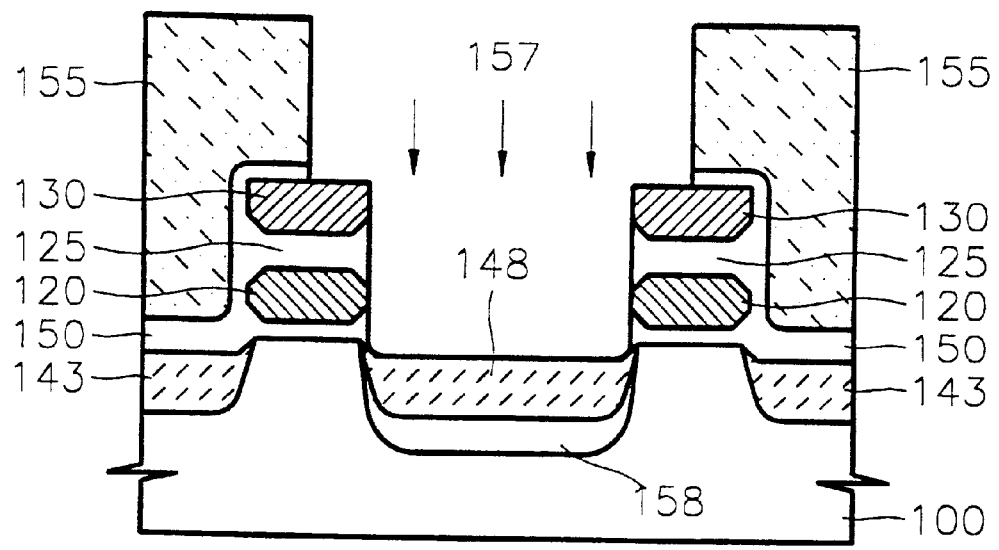
Figure 7B:
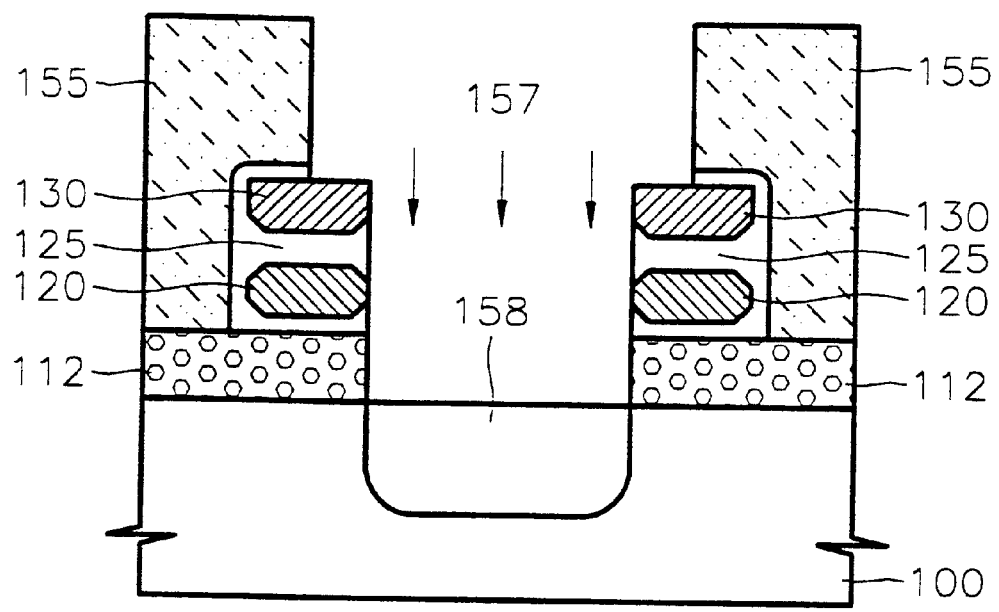

Referring to FIGS. 7A and 7B, impurities 157 are implanted using the self-aligned source etching mask 155 and the control gate 130 as an ion implantation mask. The imputies 157 are of the same conductivity as that used for forming the source region 148, As a result, a source line diffusion layer 158 for connecting source regions 148 of neighboring cells in a direction parallel to the control gate 130 is formed.

Figure 8A:
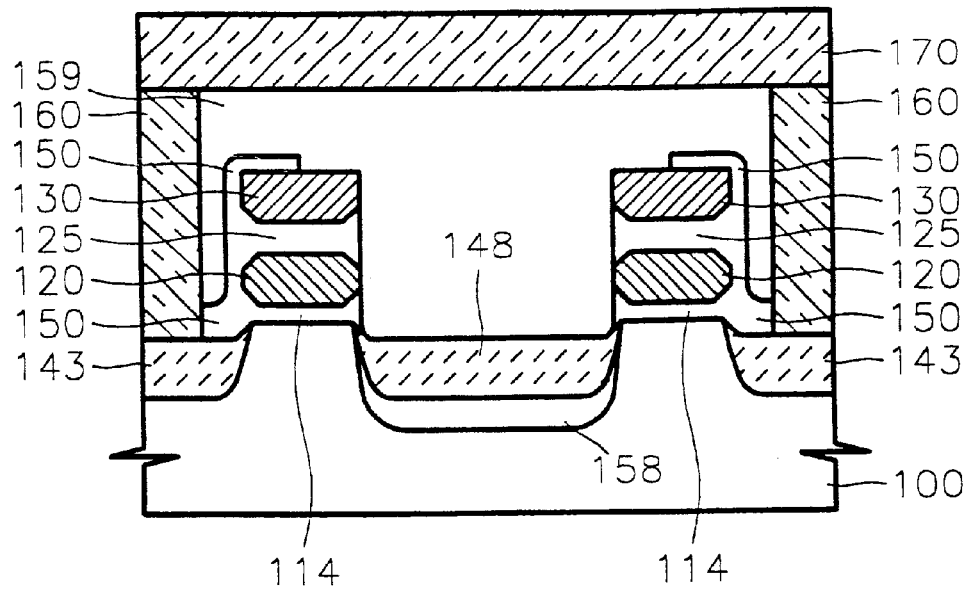
Figure 8B:
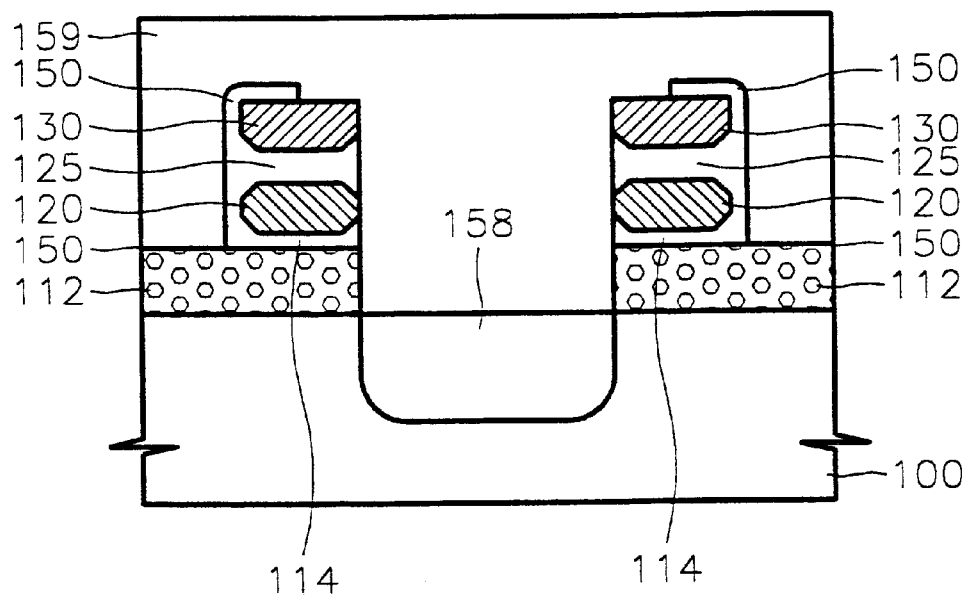

Referring to FIGS. 8A and 8B, the self-aligned source etching mask 155 is removed and then an interlevel dielectric layer 159 is formed so as to cover the stacked gate structure sufficiently. The interlevel dielectric layer 159 is formed by forming a high temperature oxide and a BPSG layer to thicknesses of 500–1000 Å and 4000–6000 Å, respectively, and then reflowing the same at 850–900 ° C. for 10–20 minutes. Subsequently, the interlevel dielectric layer 159 is patterned to form a bit line contact hole and a source line contact hole. A conductive layer is deposited to fill the contact holes and then the conductive layer is left only in the contact holes using an etch-back or chemical mechanical polishing method, thereby forming a bit line plug 160 and a source line plug (not shown). Next, a conductive layer is again formed and patterned to form a bit line 170 connected to the bit line plug 160 and a common source line (not shown) connected to the source line plug.

Alternatively a bit line and a common source line which can fill the contact holes directly may be formed without forming the plugs.

According to the manufacturing method of the present invention, after forming an etching damage prevention layer on the entire surface of a stacked gate structure and on an active region, a self-aligned source etching process is performed. Thus, side wall areas of the stacked gate structure adjacent to source regions can be prevented from being damaged during the self-aligned source etching process. Also, damage to the active region where the source regions are formed can be efficiently prevented.

Further, since the etching damage prevention layer is formed by thermal oxidation, the manufacturing process thereof is simplified, compared to a spacer forming process performed by forming a dielectric layer and then anisotropically etching the same.

What is claimed is:

1. A method for manufacturing a nonvolatile memory device comprising:

providing a semiconductor substrate;

defining a plurality of active regions by forming a plurality of field oxide layers extending parallel in one direction on the semiconductor substrate;

forming a plurality of stacked gates perpendicular to the plurality of active regions;

forming source and drain regions within the active regions exposed between the stacked gates;

forming an etching damage prevention layer on the entire surface of the stacked gates and on the active regions;

exposing the semiconductor substrate by etching the field oxide layers exposed between the stacked gates; and forming source line diffusion layers for connecting the source regions in a direction parallel to the stacked gates by implanting an impurity into the exposed semiconductor substrate.

2. The method according to claim 1, wherein the etching damage prevention layer is formed by thermal oxidation.

3. The method according to claim 2, wherein the thermal oxidation is a wet oxidation process performed at a temperature of 850–900° C. for 10–20 minutes.

4. The method according to claim 2, wherein the thermal oxidation is a dry oxidation process performed at a temperature of 850–900° C. for 20–30 minutes.

5. The method according to claim 1, wherein the stacked gate is formed by sequentially stacking a gate oxide layer, a floating gate, an intergate dielectric layer, and a control gate, and wherein the etching damage prevention layer is formed to a thickness of at least two times that of the gate oxide layer.

6. The method according to claim 1, wherein exposing the semiconductor substrate comprises forming a self-aligned source etching mask exposing the field oxide layers in a direction parallel to the stacked gates; and exposing the semiconductor substrate by etching the field oxide layers exposed by the self-aligned source etching mask and the stacked gate.

7. The method according to claim 6, wherein exposing the semiconductor substrate further comprises forming a source line diffusion layer for connecting source regions by implanting impurity into the exposed semiconductor substrate exposed using the self-aligned source etching mask and the stacked gate as an ion implantation mask.

* * * * *